United States Patent
Kaneko (10) Patent No.: US 6,221,732 B1
(45) Date of Patent: Apr. 24, 2001

(54) METHOD OF PRODUCING SEMICONDUCTOR DEVICE

(75) Inventor: Seiji Kaneko, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/547,903

(22) Filed: Apr. 11, 2000

(30) Foreign Application Priority Data

Jun. 18, 1999 (JP) .................................................. 11-172472

(51) Int. Cl.⁷ .................................................. H01L 21/76
(52) U.S. Cl. .......................................... 438/405; 438/452
(58) Field of Search ..................... 438/405, 452, 438/FOR 222, FOR 229

(56) References Cited

U.S. PATENT DOCUMENTS 4,520,553 * 6/1985 Kraft .
4,889,829 * 12/1989 Kawai .
5,801,080 * 9/1998 Inoue et al. .

* cited by examiner

Primary Examiner—George Fourson
Assistant Examiner—Joannie A. Garcia
(74) Attorney, Agent, or Firm—Nixon & Vanderhye, P.C.

(57) ABSTRACT

A method of producing a semiconductor device comprising the steps of: (a) forming partially an SOI structure portion comprising an insulation layer and a semiconductor layer on a semiconductor substrate; (b) forming selectively a first oxidation-resistant film on a region other than device isolation region-forming portions of the SOI structure portion and of an exposed portion of the semiconductor substrate; (c) forming an oxide film in the device isolation region-forming portions of the semiconductor substrate and of the SOI structure portion under such condition that the semiconductor layer of the SOI structure portion is oxidized up to the bottom of the semiconductor layer; (d) depositing a second oxidation-resistant film over the entire surface of the resultant obtained by the above steps (a) to (c); (e) etching away selectively the second oxidation-resistant film on the exposed portion of the semiconductor substrate using a resist mask so patterned as to cover the SOI structure portion; (f1) implanting an impurity ion into the semiconductor substrate using the resist mask; and (g1) removing the resist mask, and conducting heat-treatment to activate the implanted impurity ion and increase the thickness of the oxide film in the device isolation region-forming portion of the exposed portion of the semiconductor substrate to a predetermined film thickness.

12 Claims, 7 Drawing Sheets

METHOD OF PRODUCING SEMICONDUCTOR DEVICE

CROSS-REFERENCE TO RELATED APPLICATION

This application is related to Japanese application No. HEI 11(1999)-172472 filed on Jun. 18, 1999, whose priority is claimed under 35 USC § 119, the disclosure of which is incorporated by reference in its entirety.

BACKGROUND OF THE INVENTION

1. Field of the Invention

This invention relates to a production technology of semiconductor devices both on an SOI (Semiconductor On Insulator) structure portion and on a semiconductor substrate not having the SOI structure portion of a partial SOI substrate. More particularly, this invention relates to a method of producing semiconductor devices which includes a step of making the thickness of an insulation film for device isolation different between an SOI structure portion and an exposed portion of a semiconductor substrate not having the SOI structure portion, when the insulation film (oxide film) is used for device isolation in order to electrically isolate devices from one another.

2. Description of the Relate Art

The following methods are possible measures for forming device isolation regions both in SOI structure portion comprising an insulation layer and a semiconductor layer, and in an exposed substrate portion of a semiconductor substrate (hereinafter referred to as the "bulk substrate portion") in a substrate comprising the SOI structure portion and the bulk substrate portion (which substrate will be hereinafter referred to as a "partial SOI substrate"). The first method is the one that simultaneously forms both of them. When a production method is directed to fabricate complete depletion type transistors in the SOI structure portion by forming a semiconductor layer to a thin film in the SOI structure portion, the thickness of a device isolation oxide film of a field transistor of the bulk substrate portion becomes small if this device isolation oxide film is fabricated under the formation condition of the device isolation region of the SOI structure portion. Therefore, the insulation resistance of the field transistor cannot be secured sufficiently.

When the formation of the device isolation region is conducted under the formation condition of the device isolation oxide film of the bulk substrate portion, on the other hand, oxidation becomes excessive in the SOI structure portion. In consequence, a semiconductor layer (Si layer) at the ends of an active region of the SOI structure portion is oxidized, too. Thus the film thickness of the semiconductor layer becomes locally thin (i.e. the semiconductor layer at the end of the active region is thin) and the device isolation oxide film creates a stress with the result that transistor characteristics get deteriorated.

When the thickness of the device isolation oxide film of the SOI structure portion is different from the thickness of the device isolation oxide film of the bulk substrate portion, the device isolation region and a well region are generally formed by the following second method (see FIGS. 5(a) to 7(c)).

Figure 5A:
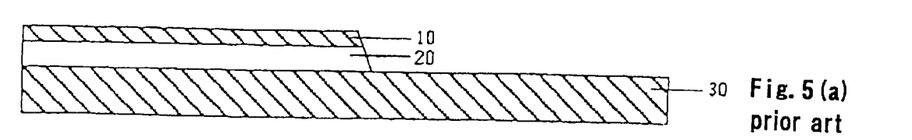
FIGS. 5(a) to 5(e) are schematic sectional views illustrating the first step to the fifth step of a conventional method of producing a semiconductor device.

FIG. 5(a) shows a partial SOI substrate. In the drawing, reference numeral 10 denotes a semiconductor layer. Reference numeral 20 denotes an insulation layer and reference numeral 30 denotes a semiconductor substrate. The following method is known as a fabrication method of this partial SOI substrate, by way of example. An oxygen ion, or the like, is implanted into a suitable depth of a semiconductor substrate (silicon substrate), and a silicon oxide layer (buried insulation layer) is formed in the silicon substrate. As a result of this process step, the silicon layer is formed on the silicon oxide layer. Next, the silicon oxide layer and the silicon layer on the former are selectively etched away, giving the structure shown in FIG. 5(a). Alternatively, the partial SOI substrate having the structure shown in FIG. 5(a) can be acquired by laminating selectively and serially the insulation layer (silicon oxide film) and the semiconductor layer (silicon layer) on a semiconductor substrate (silicon substrate).

Figure 5B:
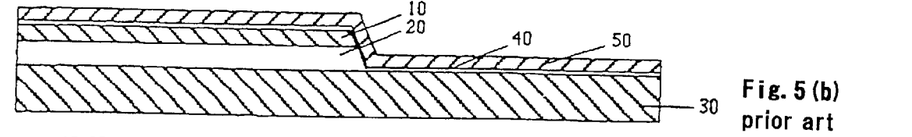

Next, as shown in FIG. 5(b), a pad oxide film 40 and a nitride film 50 are deposited over the entire surface of the substrate by thermal oxidation and by vacuum CVD, respectively.

Figure 5C:
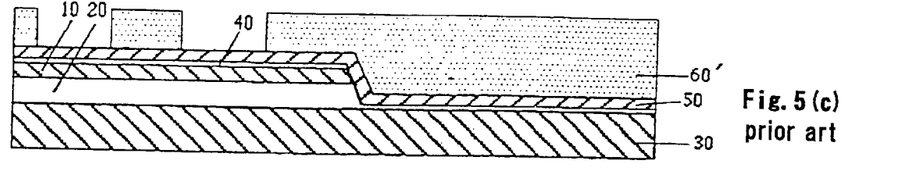
Figure 5D:
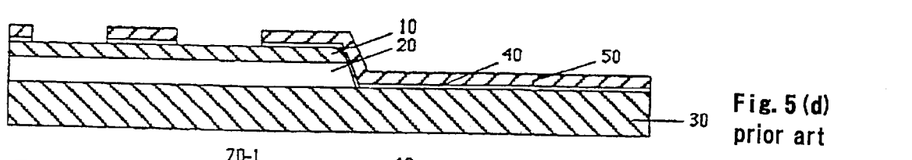
Figure 5E:
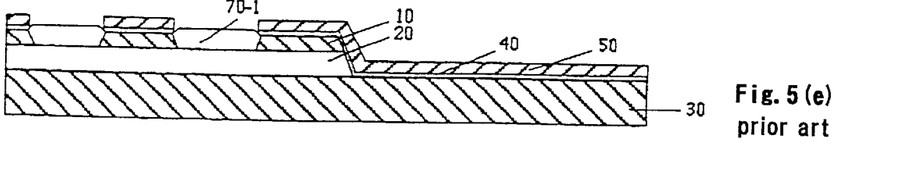

A photolithography step (resist patterning step), an etching step, and an oxidation step for forming a device isolation region, are carried out for forming an active region and a device isolation region in the SOI structure portion as shown in FIGS. 5(c) to (e). Incidentally, reference numeral 60' in FIG. 5(c) denotes a patterned photoresist mask, and reference numeral 70-1 in FIG. 5(e) denotes a device isolation oxide film in the SOI structure portion.

Figure 6A:
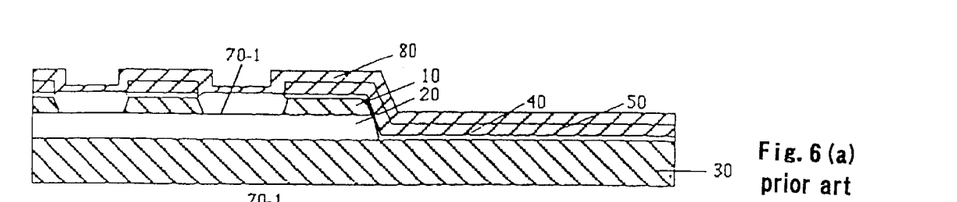
FIGS. 6(a) to 6(d) are schematic sectional views illustrating the sixth step to the ninth step of the conventional method of producing a semiconductor device.
Figure 6B:
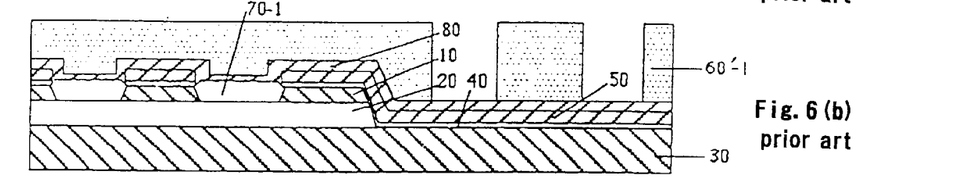
Figure 6C:
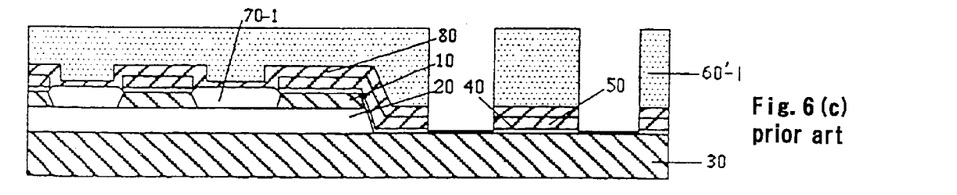
Figure 6D:
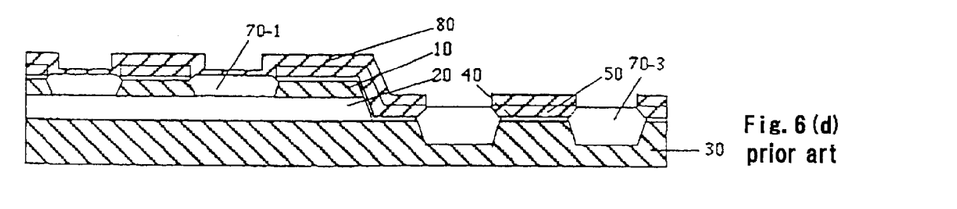
Figure 7A:
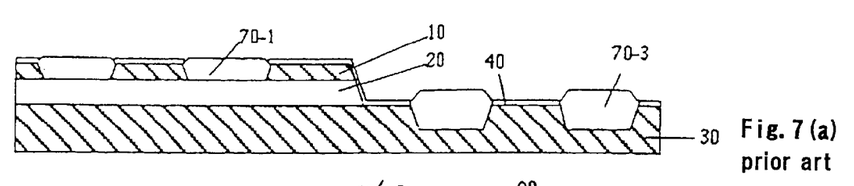
FIGS. 7(a) to 7(c) are schematic sectional views illustrating the tenth step to the twelfth step of the conventional method of producing a semiconductor device.
Figure 7B:
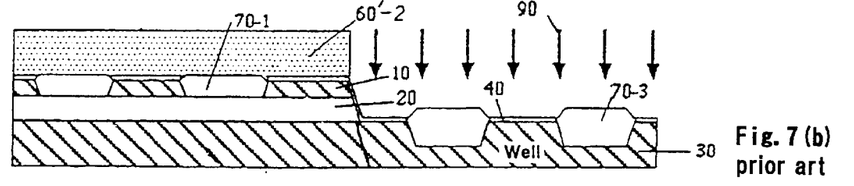
Figure 7C:
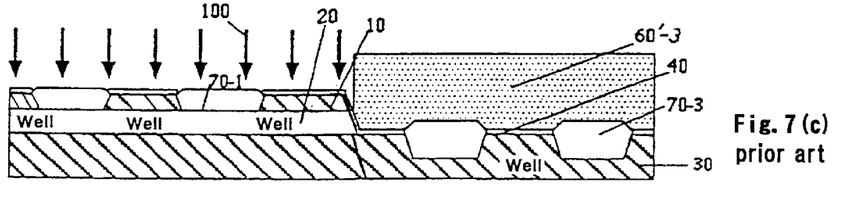

Next, a nitride film 80 is deposited by vacuum CVD as shown in FIG. 6(a). A photolithography step (resist patterning step), an etching step and an oxidation step for forming a device isolation region are carried out for forming an active region and a device isolation region subsequently for the bulk substrate portion as shown in FIGS. 6(b) to (d). Incidentally, reference numeral 60'-1 in FIG. 6(b) denotes a patterned resist mask, and reference numeral 70-3 in FIG. 6(d) denotes a device isolation oxide film in the bulk substrate portion. Thereafter, the nitride films 50 and 80 are etched away. Resist masks 60'-2 and 60'-3 for forming the well are formed in the SOI structure portion and the bulk substrate portion, respectively, as shown in FIGS. 7(a) to (c). Next, an impurity ion is implanted (90 and 100) into each region, and annealing treatment is carried out for activation, thereby giving the well.

In the production method of a semiconductor device using a partial SOI substrate, the second method described above is generally used in order to acquire reliably the desired device characteristics. According to this method, however, the photolithography step, the etching step and the oxidation step for forming the device isolation region must be carried out for both SOI structural portion and bulk substrate portion. Furthermore, the photolithography step for forming the wells must also be carried out for the SOI structure portion and the bulk substrate portion (see FIGS. 5(c), 6(b), 7(b) and 7(c)). In other words, the photolithography step must be conducted four times in total. The number of the photolithography steps must be decreased in order to decrease the production time and the production cost.

SUMMARY OF THE INVENTION

According to one aspect of the present invention, there is provided a first method of producing a semiconductor device, which method comprises the steps of:

(a) forming partially an SOI structure portion comprising an insulation layer and a semiconductor layer on a semiconductor substrate;

(b) forming selectively a first oxidation-resistant film on a region other than device isolation region-forming portions of the SOI structure portion and of an exposed portion of the semiconductor substrate;

c) forming an oxide film in the device isolation region-forming portions of the semiconductor substrate and of the SOI structure portion under such condition that the semiconductor layer of the SOI structure portion is oxidized up to the bottom of the semiconductor layer;

(d) depositing a second oxidation-resistant film over the entire surface of the resultant obtained by the above steps (a) to (c);

(e) etching away selectively the second oxidation-resistant film on the exposed portion of the semiconductor substrate using a resist mask so patterned as to cover the SOI structure portion;

(f1) implanting an impurity ion into the semiconductor substrate using the resist mask; and (g1) removing the resist mask, and conducting heat-treatment to activate the implanted impurity ion and increase the thickness of the oxide film in the device isolation region-forming portion of the exposed portion of the semiconductor substrate to a predetermined film thickness.

According to another aspect of the present invention, there is provided a second method of producing a semiconductor device which method comprises the steps of:

(a) forming partially an SOI structure portion comprising an insulation layer and a semiconductor layer on a semiconductor substrate;

(b) forming selectively a first oxidation-resistant film on a region other than device isolation region-forming portions of the SOI structure portion and of an exposed portion of the semiconductor substrate;

(c) forming an oxide film in the device isolation region-forming portions of the semiconductor substrate and of the SOI structure portion under such condition that the semiconductor layer of the SOI structure portion is oxidized up to the bottom of the semiconductor layer;

(d) depositing a second oxidation-resistant film over the entire surface of the resultant obtained by the above steps (a) to (c);

(e) etching away selectively the second oxidation-resistant film on the exposed portion of the semiconductor substrate using a resist mask so patterned as to cover the SOI structure portion;

(f2) removing the resist mask and subsequently implanting an impurity ion into the semiconductor substrate and into the semiconductor layer of the SOI structure portion; and (g2) conducting heat-treatment to activate the implanted impurity ion and increase the thickness of the oxide film in the device isolation region-forming portion of the exposed portion of the semiconductor substrate to a predetermined film thickness.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The first production method of the semiconductor device according to the present invention forms an oxide film of the SOI structure portion to a thickness different from the thickness of an oxide film of the device isolation region-forming portion in the bulk substrate portion by the following process steps.

First, photolithography and etching are carried out in order to form the device isolation regions of both of the SOI structure portion and the bulk substrate portion. Next, an oxidation step for forming the device isolation region is conducted so that the device isolation oxide film in the SOI structure portion attains a desired thickness. After a second oxidation-resistant film is deposited, a photolithography step is conducted in such a manner that the portions other than the bulk substrate portion are covered with a photoresist. Next, the second oxidation-resistant film of the bulk substrate portion is etched, and well implantation of the bulk substrate portion is carried out. After the resist is removed, an oxidation step for forming the device isolation region is added to only the bulk substrate portion. As a result, the photolithography steps made three times provide the device isolation region-forming oxide film having a desired thickness and the well in both SOI structure portion and bulk substrate portion.

The second production method of the semiconductor device according to the present invention forms oxide films of device isolation region-forming portions of an SOI structure portion and a bulk substrate portion to mutually different film thickness by the following process steps.

First, photolithography and etching are carried out to form the device isolation region of both SOI structure portion and bulk substrate portion. The oxidation step for forming the device isolation region is then conducted so that the device isolation oxide film in the SOI structure portion attains a desired thickness. After the second oxidation-resistant film is deposited, the photolithography step is carried out in such a fashion that the portion other than the bulk substrate portion is covered with a photoresist. Next, the second oxidation-resistant film of the bulk substrate portion is etched. After the resist is removed, well implantation is done to the SOI structure portion and to the bulk substrate portion.

The oxidation step for forming the device isolation region is subsequently added to only the bulk substrate portion. As a result, the photolithography steps made twice provide the device isolation region-forming oxide film having a desired thickness and the well in both SOI structure portion and bulk substrate portion.

In other words, the production method of the semiconductor device according to the present invention can form the device isolation region-forming oxide film having an optimum thickness and the well in both SOI structure portion and bulk substrate portion by a smaller number of photolithography steps than in the prior art methods.

Hereinafter, the present invention will be explained in detail.

FIGS. 1(a) to 3(d) are sectional views each showing a production step of in accordance of the first method of producing the semiconductor device according to the present invention.

FIG. 1(a) shows a partial SOI substrate. Reference numeral 10 denotes a semiconductor layer, reference numeral 20 denotes an insulation layer and reference numeral 30 denotes a semiconductor substrate. This partial SOI substrate can be produced by the following method, for example. When the semiconductor substrate is a silicon substrate, an ion such as oxygen ion is implanted in a suitable depth into the silicon substrate to form a buried insulation layer consisting of a silicon oxide layer into the silicon substrate. This process step provides a semiconductor layer comprising a silicon layer on the silicon oxide layer. Next, the silicon oxide layer and the silicon layer on the former are selectively etched away, giving the structure shown in FIG. 1(a). Alternatively, the partial SOI substrate having the structure shown in FIG. 1(a) can be obtained by a method that laminates selectively an insulation layer (a silicon oxide film, for example) and a semiconductor layer (a silicon layer, for example) on the semiconductor substrate (a silicon substrate, for example).

Next, a first oxidation-resistant film comprising a pad oxide film 40 formed by thermal oxidation and a nitride film 50 formed by vacuum CVD, for example, is deposited over the entire surface of the substrate as shown FIG. 1(b).

A photolithography step (resist patterning step), that defines an active region and a device isolation region, and an etching step of the nitride film 50 and the pad oxide film 40 is then carried out for both SOI structure portion and bulk substrate portion as shown in FIGS. 1(c) and (d). Incidentally, reference numeral 60 in FIG. 1(c) denotes the photoresist layer that is so patterned.

After the photoresist layer 60 is removed, oxide films 70-1 and 70-2 for device isolation are formed on both SOI structure portion and bulk substrate portion by a selective oxidation method (a LOCOS method) as shown in FIG. 1(e). This oxidation step is carried out under the condition where the active region is sufficiently insulated and isolated in the SOI structure portion and the film thickness of the semiconductor layer does not become locally small at the end of the active region in the SOI structure portion. When the thickness of the semiconductor layer of the SOI structure portion is 50 nm, for example, the thickness of the device isolation oxide film is preferably from 125 to 140 nm (2.5 to 2.8 times). The reason why the thickness of the oxide film is greater than that of the semiconductor layer is because, if oxidation is made to only the thickness of the semiconductor layer, device isolation cannot be made sufficiently, and over-oxidation is effected to cope with such a problem.

Figure 1:
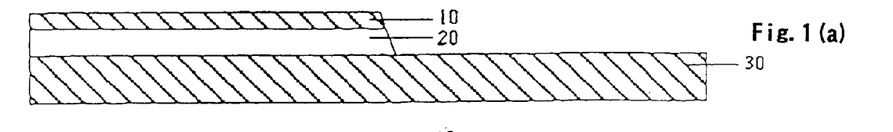
FIGS. 1(a) to 1(e) are schematic sectional views illustrating the first step to the fifth step in accordance of a first method of producing a semiconductor device of the present invention.
Figure 2A:
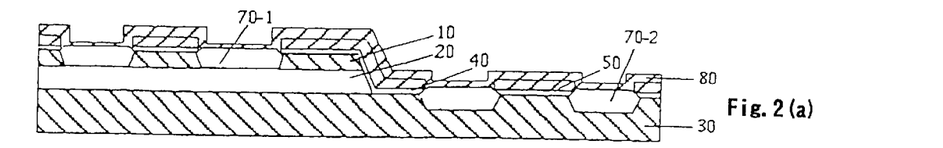
FIGS. 2(a) to 2(c) are schematic sectional views illustrating the sixth step to the eighth step in accordance of the first method of producing a semiconductor device of the present invention.
Figure 2B:
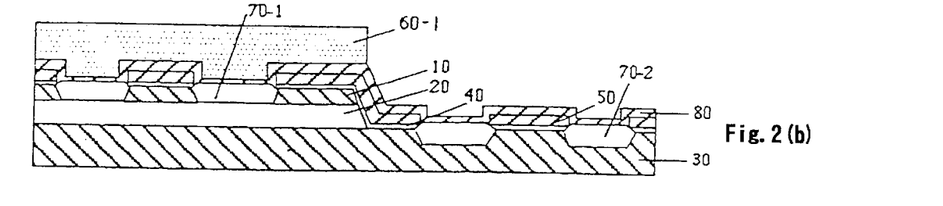
Figure 2C:
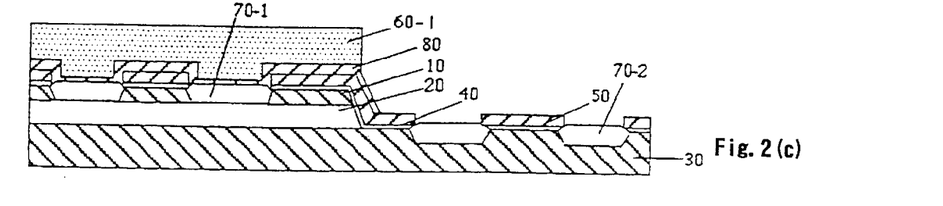

Next, a second oxidation-resistant film such as a nitride film 80 is deposited by a vacuum CVD method over the entire surface of the substrate as shown in FIG. 2(a). A photolithography step is then carried out in such a manner as to cover the SOI structure portion as a whole as shown in FIG. 2(b), giving a photoresist mask 60-1. The nitride film 80 over the bulk substrate portion is etched away to the extent corresponding to its film thickness using the photoresist mask 60-1 as shown in FIG. 2(c). In consequence, the device isolation oxide film 70-2 is exposed.

Figure 3A:
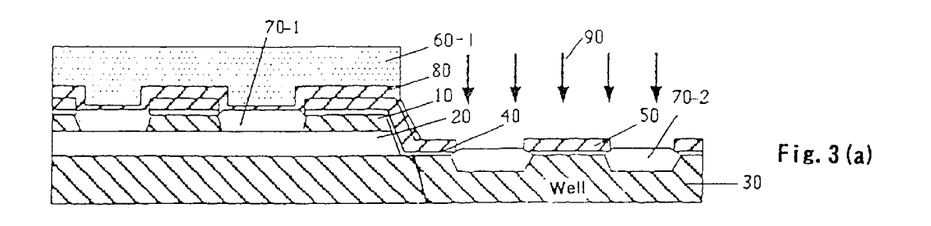
FIGS. 3(a) to 3(d) are schematic sectional views illustrating the ninth step to the twelfth step in accordance of the first method of producing a semiconductor device of the present invention.

Well implantation 90 necessary for fabricating the device is conducted for the bulk substrate portion before the photoresist 60-1 is removed, as shown in FIG. 3(a). For example, when the film thickness of the pad oxide film is 5 to 10 nm, the film thickness of the nitride film is 40 to 45 nm and a P-type well is formed by this well implantation, well implantation is conducted under a condition of Rp (mean implantation depth) beneath a device isolation region oxide film and beneath a source/drain junction, both being to be fabricated in subsequent process steps. In this case, it is preferred to implant $^{11}B^+$ ions at 130 to 180 keV in a dose of 1 to 7E12 ions/cm$^2$ beneath the device isolation oxide film, and $^{11}B^+$ ions at 60 to 110 keV in a dose of 1 to 7E12 ions/cm$^2$ beneath the source/drain junction. It is also preferred to implant 11B$^+$ions at 35 to 45 keV in a dose of 1 to 7E12 ions/cm$^2$ to the outermost layer of the substrate as implantation of the impurity ion for determining a channel concentration that in turn determines the transistor characteristics.

Figure 3B:
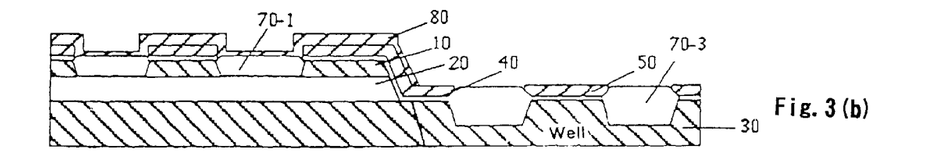

After this well implantation step, the photoresist 60-1 is removed. The device isolation region-forming oxidation is added further to the device isolation region of the bulk substrate portion as shown in FIG. 3(b), forming a device isolation oxide film 70-3. At this time, the thickness of the device isolation oxide film of the bulk substrate portion after this device isolation region-forming oxidation is added is preferably the thickness that can sufficiently secure the insulation resistance in the field transistor that is to be formed finally in the bulk substrate portion. For example, the thickness of the device isolation oxide film is 320 to 400 nm (about 2.3 to about 3.2 times of the former thickness).

Figure 3C:
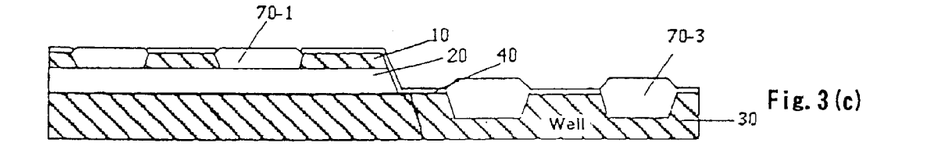
Figure 3D:
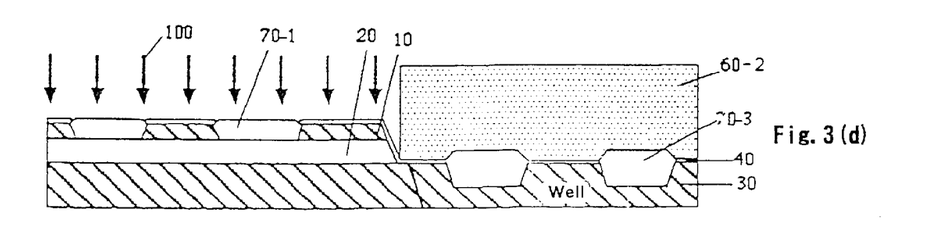

Next, the nitride film on the active region is etched away using an etchant for the nitride film such as phosphoric acid, as shown in FIG. 3(c). A photolithography step is then carried out in such a manner as to cover the bulk substrate portion as a whole as shown in FIG. 3(d), giving a photoresist mask 60-2. A P-type impurity ion is implanted, as ion implantation 100 for controlling a threshold value, into a semiconductor layer, that is to function as an active region encompassed by the device isolation region of the SOI structure portion, through a pad oxide film 40 with this photoresist mask 60-2 as a mask. In this way is formed an ion implantation layer by the P-type impurity ion, which becomes a well region. When the thickness of the pad oxide film on the semiconductor layer of the SOI structure portion is 5 to 10 nm at this time, for example, ion implantation of the P-type impurity ion is effected in such a fashion as to define a peak at the center of the semiconductor layer. More concretely, $^{11}B^+$ ions or $^{49}BF_2^+$ ions are preferably implanted in a dose of 0.2 to 1E13 ions/cm$^2$ at 5 to 15 keV and 20 to 70 keV, respectively.

After the process steps described above, the device can be produced by following the production process in the same way as ordinary semiconductor devices. For example, well implantation is effected onto the SOI structure portion and then the resist mask 60-2 is removed. The pad oxide film is etched away using an oxide film etchant such as hydrofluoric acid (HF), and a gate insulation film is formed in the active region over the entire surface of the substrate. At this time, the film thickness of the gate insulation film is preferably 7 to 10 nm if the channel length is 0.35 μm, for example.

Next, a polysilicon film is formed over the entire surface of the gate insulation film by a vacuum CVD method. The polysilicon film is then processed through a photolithography step and an etching step to form a gate electrode. A silicon oxide film is deposited over the entire surface of the semiconductor substrate by a CVD method, or the like, and side wall spacers are formed on the side wall of the gate electrode by anisotropic etching. Next, $^{31}P^+$ ions as an N-type impurity ion are implanted to the entire surface of the semiconductor substrate from the direction of its normal using the gate electrode and the side wall spacers as the mask. Consequently, an N-type impurity ion layer as a source/drain region and an N-type gate electrode are formed. The impurity ion is then activated by means of lamp annealing. Next, an inter-layer insulation film is formed, and contact holes are bored through a photolithography step and an etching step. A metal is deposited subsequently to form a plug in each contact hole, and a metal wiring is processed. Finally, a semiconductor device is completed.

In this embodiment, the number of photolithography steps necessary for forming the device isolation regions having different film thickness and the well in both SOI structure portion and bulk substrate portion is three times.

Next, an example of the second production method of the semiconductor device according to the present invention will be explained with reference to FIGS. 4(a) to (c). The process steps up to the step shown in FIG. 2(c) are the same as those of the first method.

As the process steps after FIG. 2(c), the resist mask 60-1 is removed before well implantation and device isolation region-forming oxidation are conducted to the bulk substrate portion. Impurity ion implantation 110 is effected simultaneously for both SOI structure portion and bulk substrate portion (FIG. 4(a)). At this time, well implantation in the bulk substrate portion must be effected at least once in order to suppress leak between the devices and to form high concentration portions beneath the device isolation oxide film and beneath the junction of the source/drain region that is to be later formed. Furthermore, impurity ion implantation must be effected to the outermost surface portion of the substrate in order to determine the channel concentration that determines the transistor characteristics. In other words, well implantation must be carried out at least twice in total. In the SOI structure, however, only the impurity ion that determine the channel concentration in the bulk substrate portion is implanted to the semiconductor layer. In the ion implantation process that forms the high concentration portions beneath the device isolation oxide film in the bulk substrate portion and beneath the junction of the source/drain region formed in the subsequent process step, the impurity ion is implanted into the buried oxide film in the SOI structure portion or into the semiconductor substrate. For this reason, ion implantation does not particularly affect the device characteristics of the SOI structure portion. When impurity ion implantation for the well formation is effected simultaneously to both SOI structure portion and bulk substrate portion, the photolithography step and the ion implantation steps for forming the well of the SOI structure portion in the aforementioned embodiment can be omitted, and the cost of production can be further reduced.

Figures 4A, 4B, 4C:
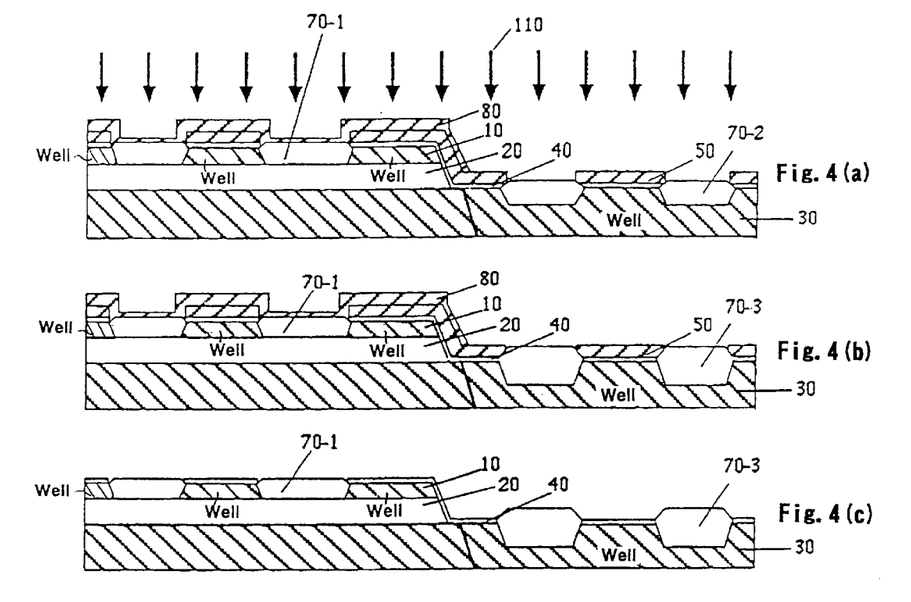
FIGS. 4(a) to 4(c) are schematic sectional views illustrating the ninth step to the eleventh step in accordance of a second method of producing a semiconductor device of the present invention.

After impurity ion implantation is effected simultaneously to both SOI structure portion and bulk substrate portion, oxidation for forming the device isolation region is added to only the bulk substrate portion, and a device isolation oxide film 70-3 is formed (FIG. 4(b)). Subsequently, the nitride film over the active region is etched away using a nitride film etchant such as phosphoric acid (FIG. 4(c)). Formation of the device isolation region and the well can be conducted in this way.

The well can be formed also when the process steps shown in FIGS. 4(a) to (c) are carried out subsequent to the process step shown in FIG. 6(d) in the production process of the semiconductor device according to the prior art technology. The number of the photolithography steps can be reduced, too. In this case, however, the annealing step for activation becomes necessary after impurity ion implantation is conducted simultaneously to both SOI structure portion and bulk substrate portion.

As described above in detail, the present invention can acquire the device isolation oxide films each having a desired thickness and the well structure optimal for respective device characteristics in both SOI structure portion and bulk substrate portion, without increasing the number of process steps.

What is claimed is:

1. A method of producing a semiconductor device comprising the steps of:
   (a) forming partially an SOI structure portion comprising an insulation layer and a semiconductor layer on a semiconductor substrate;
   (b) forming selectively a first oxidation-resistant film on a region other than device isolation region-forming portions of the SOI structure portion and of an exposed portion of the semiconductor substrate;
   (c) forming an oxide film in the device isolation region-forming portions of the semiconductor substrate and of the SOI structure portion under such condition that the semiconductor layer of the SOI structure portion is oxidized up to the bottom of the semiconductor layer;
   (d) depositing a second oxidation-resistant film over the entire surface of the resultant obtained by the above steps (a) to (c);
   (e) etching away selectively the second oxidation-resistant film on the exposed portion of the semiconductor substrate using a resist mask so patterned as to cover the SOI structure portion;
   (f1) implanting an impurity ion into the semiconductor substrate using the resist mask; and
   (g1) removing the resist mask, and conducting heat-treatment to activate the implanted impurity ion and increase the thickness of the oxide film in the device isolation region-forming portion of the exposed portion of the semiconductor substrate to a predetermined film thickness.

2. A method according to claim 1, wherein the ion-implantation of the impurity ion is conducted to form a well.

3. A method according to claim 1, wherein the oxide film in the device isolation region-forming portion of the SOI structure portion has a thickness which is 2.5 to 2.8 times larger than the thickness of the semiconductor layer of the SOI structure portion.

4. A method according to claim 1, wherein the oxide film in the device isolation region-forming portion of the exposed portion of the semiconductor substrate after the step (g1) has a thickness which is 2.3 to 3.2 times larger than the thickness thereof before the step (g1).

5. A method according to claim 1, wherein the oxide film in the device isolation region-forming portion of the exposed portion of the semiconductor substrate has a thickness of 320 nm to 400 nm after the step (g1).

6. A method according to claim 1, wherein the ion-implantation of the impurity ion is conducted to form a well and determined a channel concentration.

7. A method of producing a semiconductor device comprising the steps of:
(a) forming partially an SOI structure portion comprising an insulation layer and a semiconductor layer on a semiconductor substrate;
(b) forming selectively a first oxidation-resistant film on a region other than device isolation region-forming portions of the SOI structure portion and of an exposed portion of the semiconductor substrate;
(c) forming an oxide film in the device isolation region-forming portions of the semiconductor substrate and of the SOI structure portion under such condition that the semiconductor layer of the SOI structure portion is oxidized up to the bottom of the semiconductor layer;
(d) depositing a second oxidation-resistant film over the entire surface of the resultant obtained by the above steps (a) to (c);
(e) etching away selectively the second oxidation-resistant film on the exposed portion of the semiconductor substrate using a resist mask so patterned as to cover the SOI structure portion;
(f2) removing the resist mask and subsequently implanting an impurity ion into the semiconductor substrate and into the semiconductor layer of the SOI structure portion; and
(g2) conducting heat-treatment to activate the implanted impurity ion and increase the thickness of the oxide film in the device isolation region-forming portion of the exposed portion of the semiconductor substrate to a predetermined film thickness.

8. A method according to claim 7, wherein the ion-implantation of the impurity ion is conducted to form a well.

9. A method according to claim 7, wherein the oxide film in the device isolation region-forming portion of the SOI structure portion has a thickness which is 2.5 to 2.8 times larger than the thickness of the semiconductor layer of the SOI structure portion.

10. A method according to claim 7, wherein the oxide film in the device isolation region-forming portion of the exposed portion of the semiconductor substrate after the step (g2) has a thickness which is 2.3 to 3.2 times larger than the thickness thereof before the step (g2).

11. A method according to claim 7, wherein the oxide film in the device isolation region-forming portion of the exposed portion of the semiconductor substrate has a thickness of 320 nm to 400 nm after the step (g2).

12. A method according to claim 7, wherein the ion-implantation of the impurity ion is conducted to form a well and determined a channel concentration.

* * * * *